United States Patent [19]
Kuribayashi et al.

[11] Patent Number: 6,085,146
[45] Date of Patent: Jul. 4, 2000

[54] INFORMATION RECEIVING METHOD, NAVIGATION APPARATUS AND MOTORCAR

[75] Inventors: Atsushi Kuribayashi, Kanagawa; Masao Morita, Tokyo, both of Japan

[73] Assignee: Sony Corporation, Tokyo, Japan

[21] Appl. No.: 09/064,508

[22] Filed: Apr. 23, 1998

[30] Foreign Application Priority Data

Apr. 24, 1997 [JP] Japan ................................. 9-107580

[51] Int. Cl.[7] .......................... G01C 21/00; G06F 165/00
[52] U.S. Cl. .......................... 701/200; 701/208; 340/990; 340/995
[58] Field of Search ..................................... 701/200, 207, 701/208, 209, 210, 211; 340/988, 990, 995; 455/161.2, 186.1; 73/178 R

[56] References Cited

U.S. PATENT DOCUMENTS

| | | | |
|---|---|---|---|
| 5,152,012 | 9/1992 | Schwob | 455/161.2 |
| 5,406,490 | 4/1995 | Braegas | 701/210 |
| 5,864,305 | 1/1999 | Rosenquist | 701/208 |
| 5,892,463 | 4/1999 | Hikita et al. | 701/209 |
| 5,908,464 | 6/1999 | Kishigami et al. | 701/209 |
| 5,933,094 | 8/1999 | Goss et al. | 701/208 |
| 5,961,569 | 10/1999 | Craport et al. | 701/208 |

*Primary Examiner*—Gary Chin
*Attorney, Agent, or Firm*—Jay H. Maioli

[57] ABSTRACT

An information receiving method is one of receiving a district information transmitted at a predetermined frequency and then displaying a received district information, and includes a step of estimating a current location and then estimating whether a district information of an area to which the estimated current location pertains is contained in a received signal, and a step of performing, if it is estimated that the district information of the area to which the current location pertains is not contained in the received signal, a process for changing the receiving frequency.

10 Claims, 6 Drawing Sheets

| Prefectures | Frequency | Secondary Meshes to be covered |
|---|---|---|
| Tokyo | 82.5 | 5 3 3 9 1 3, 5 3 3 9 2 3, 5 3 3 9 2 5, 5 3 3 9 2 6 ...... |
| Kanagawa | 81.7 | 5 2 3 8 6 7, 5 2 3 8 7 7, 5 2 3 9 5 0, 5 2 3 9 5 1 ...... |
| Saitama | 85.1 | ---------- |
| Chiba | 80.9 | ---------- |

INFORMATION RECEIVING METHOD, NAVIGATION APPARATUS AND MOTORCAR

BACKGROUND

1. Field of the Invention

The present invention relates to an information receiving method for receiving, for example, a road traffic information multiplexed over a radio broadcast wave and then making the received traffic information to be displayed together with a road map or the like, a navigation apparatus to which the information receiving method is applied, and a motorcar in which this navigation apparatus is installed.

2. Background of the Invention

Various navigation apparatus which are to be mounted on a motorcar and the like have been developed. The navigation apparatus comprises a data storing means of large capacity such as a CD ROM or the like in which, for example, a road map data is stored, a detector means for detecting a current location, and a display device for displaying the road map in the vicinity of the detected current location on the basis of the data read out of the data storing means. In this case, for the detector means of the current location, there are what uses a positioning system utilizing an artificial satellite for positioning, which is called a GPS (Global Positioning System) (hereinafter merely referred to as a GPS), what uses an autonomous navigation for tracking a change of the current location from a starting point on the basis of information on the direction and the speed of a vehicle, and so forth.

Such data of the road map in the vicinity of the current location detected by the detector means of the current location is read out of a data storing means of large capacity such as the CD ROM or the like and an image signal for displaying the road map is then produced. This image signal is supplied to a display device for displaying the road map in the vicinity of the current location.

In the meantime, there is such a navigation apparatus that displays not only the road map, etc. but also receives a traffic information such as a congested road information or the like and displays the received traffic information on the road map etc. In this case, concerning the reception method of the traffic information, when a system termed e. g. a VICS (Vehicle Information and Communication System) is utilized, there are two ways in one of which the traffic information is obtained by receiving a data broadcast transmitted from a broadcasting station multiplexed over an FM broadcast (radio broadcast) and in the other of which the traffic information is obtained by receiving an infrared-ray signal or an electric wave transmitted from a beacon installed in the vicinity of a road when passing the vicinity of the beacon.

By receiving such traffic information through the navigation apparatus and performing a corresponding display or the like, information such as congested road information which varies every moment, a traffic regulation and so on can be received in a moving car, thus causing the car to be guided. For example, it is possible for a driver to estimate an appropriate route to avoid the traffic jam, based on the displayed information. In case of the navigation apparatus which is capable of establishing a route to a destination, it is also possible to determine automatically the route avoiding the traffic jam based on the received information and to guide the car.

In the meantime, when receiving the traffic information multiplexed over the broadcast wave in the above VICS system and the like, it is necessary to appropriately select a channel (frequency) over which the traffic information is multiplexed and then receive the same. For example, in a system which is now practiced in Japan, frequencies of broadcast wave by which the traffic informations of the administrative districts are transmitted are predetermined in the respective administrative districts, so that it is necessary to set the receiving frequency to a frequency at which the traffic information of the current location (the administrative district) is receivable through user's operation or the like.

In addition, if a motorcar on which the navigation apparatus is mounted moves to change its location (e. g. if it enters another administrative district), it is necessary to change the receiving frequency for receiving the traffic information.

In this regard, when receiving the traffic information multiplexed over a conventional broadcast wave, information of an adjacent broadcasting station contained in the information multiplexed over the broadcast wave is utilized for processing to change the receiving frequency. In other words, when the traffic information or the like is multiplexed over the broadcast wave, information concerning a transmitting frequency of an adjacent broadcasting station in the same network is contained as the multiplexed information. Thus, if a received condition of the broadcast wave which is now under reception becomes worse, an attempt to receive the adjacent broadcasting station indicated by the adjacent broadcasting station information is made. Then, if a better reception than that of the broadcasting station which is now being received can be obtained, a processing to change over to the reception of the adjacent broadcasting station will be performed.

However, if it is arranged in this manner to search the station which can be received better based on the information of adjacent broadcasting station and then change over to receive that station, the station which gives the traffic information of the vicinity of the present moving location will not necessarily be received. This raises a problem. Particularly, even if the broadcasting station which transmits the multiplexed traffic information exists at a unit of the administrative district, there are many cases where in a district in the proximity of a prefectual border, etc. the broadcasting station of an adjacent prefecture can be turned better than that of a prefecture to which the current location pertains. Therefore, if the receiving frequency is changed over relying upon only information transmitted from the adjacent broadcasting station, there will occur such a case where the traffic information concerning the road in question where the car is moving cannot be acquired, but the traffic information of some other district (prefecture) is wrongly received.

Accordingly, there has been the problem in which, if it is arranged to receive the traffic information, etc. by the automatic frequency setting, then the traffic information of the different district from the moving location at that time may be received, so that the required information of the district concerned will not necessary be acquired.

Further, while the case of receiving the traffic information has been described here, the information transmitted in the multiplexed manner over the broadcast wave such as an FM broadcast or the like contains other informations. For example, information of weather forecast, news and so on are also transmitted. When receiving also such information, if a district indicated by the information (e. g. a district corresponding to the weather forecast) does not coincide with the current location, the received information will make no sense, which raises a problem.

SUMMARY OF THE INVENTION

In view of such aspects, it is an object of the present invention that when receiving an information such as the traffic information or the like which is directed to a limited district, its reception frequency can be set appropriately.

According to a first aspect of the present invention, an information receiving method of receiving a district information transmitted at a predetermined frequency and then displaying a received district information includes a step of estimating a current location and then estimating whether a district information of an area to which the estimated current location pertains is contained in a received signal, and a step of performing, if it is estimated that the district information of the area to which the current location pertains is not contained, in the received signal a process for changing the receiving frequency.

According to a second aspect of the present invention, a navigation apparatus includes a recording medium of a map information, a readout unit of the map information recorded in the recording medium, a location estimating unit, a signal receiving unit for receiving a district information transmitted at a predetermined frequency, a map display processing unit which makes the readout unit read a map information in the vicinity of a location estimated by the location estimating unit and then processes to display a map according to the read out map information and a district information received by the signal receiving unit, a frequency list storing unit for storing an information concerning a frequency received by the receiving unit, and a frequency control unit which estimates whether the district information of the area corresponding to the location estimated by the location estimating unit is contained in a signal received by the signal receiving unit and which, if the district information of the area concerned is not contained in the received signal, makes a control to change the frequency received by the signal receiving unit.

According to a third aspect of the present invention, a motorcar includes a recording medium of a map information, a readout unit of the map information recorded in the recording medium, a location estimating unit for estimating a location of one's own motorcar, a signal receiving unit for receiving a district information transmitted at a predetermined frequency, a map display processing unit which makes the readout unit read a map information in the vicinity of a location estimated by the location estimating unit and then processes to produce a display signal for displaying a map according to the map information readout and the district information received by the signal receiving unit, a frequency list storing unit for storing an information concerning a frequency which is received by the signal receiving unit, a frequency control unit which estimates whether the district information of the area corresponding to the location estimated by the location estimating unit is contained in a signal received by the signal receiving unit and which, if the district information of the area concerned is not contained in the received signal, makes a control to change the frequency received by the signal receiving unit, and a display for displaying the district information and the map according to the display signal produced by the map display processing unit.

DESCRIPTION OF THE PREFERRED EMBODIMENTS

An embodiment according to the present invention will be described below with reference to the accompanying drawings.

Figure 1:
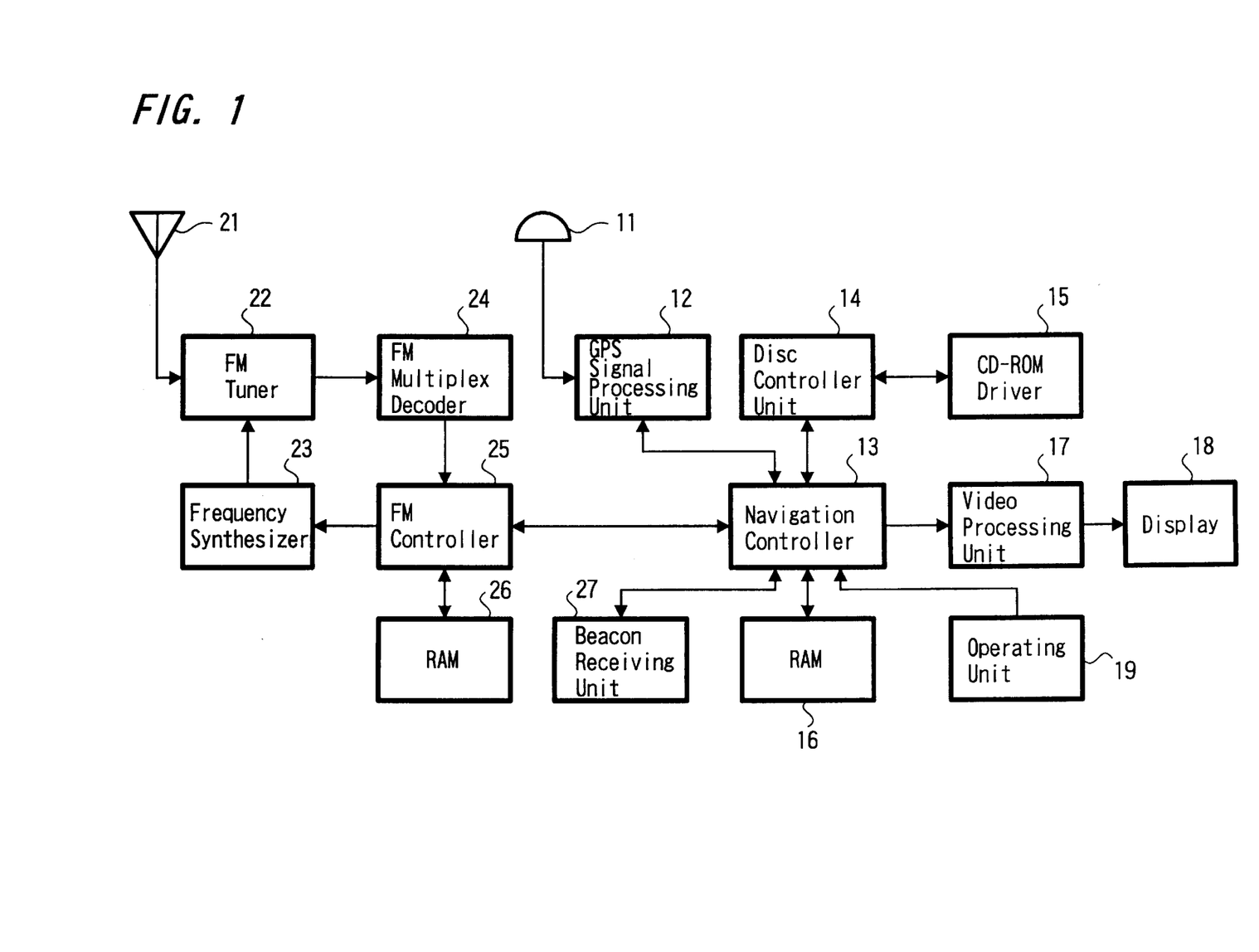
FIG. 1 is a block diagram showing the apparatus according to an embodiment of the present invention.

In the present embodiment, the present invention is applied to a navigation apparatus which is mounted on a moving body or vehicle (here, a motorcar) for use, a whole configuration of which is shown in FIG. 1. This navigation apparatus is mounted on the moving body such as a motorcar or the like for use, but it may be made compact, for example, so that it can be carried about by a person for portable use.

Referring to FIG. 1, the configuration of the navigation apparatus according to the present embodiment will be described below. An antenna 11 for the GPS is connected to the navigation apparatus of this example and a signal received through the antenna 11 is supplied to a GPS signal processing unit 12. The GPS signal processing unit 12 performs a receiving process for a positioning system called a GPS (Global Positioning System). Particularly, it receives positioning or position measuring signals for the GPS transmitted from a plurality of artificial satellites for the positioning and then analyses data contained in the signals to acquire data of a current location (latitude, longitude, altitude). The data of the current location acquired by the GPS signal processing unit 12 is supplied to a navigation controller 13.

The navigation controller 13 is a controller which carries out such a control that a road map in the proximity of the current location thus positioned or measured is displayed. When it acquires the positioning data of the location from the GPS signal processing unit 12, it will send a command to a disc control unit 14 for reading the road map in the proximity of that location. The disc control unit 14 controls the readout of the map data from a CD ROM (here, this is a map disc in which the road map data is recorded) installed in a CD ROM driver 15, and causes the map data read out to be stored in a RAM 16 connected to the controller 13.

The road map data stored in the map disc is made, for example, in the form of a link data which is comprised of coordinates position data of a starting point and a terminal point of each of the roads and the vector data connecting these starting and terminal points. Moreover, associated data (such as data on the shape of a building adjacent to the road and a road name, a place name and so on) which are needed when displaying the road map are also stored in the map disk.

When the map data read out of the map disk storing the recorded data is transferred to the RAM 16, the controller 13 performs a process to depict the road map of a predetermined range of the map data for making a picture data (display signal). Subsequently, the road map data which is made into a predetermined picture data is supplied from the controller 13 to an image processing unit 17 where the data is made into an image signal of a predetermined standard (e.g. RGB signal) for display. The image signal is then supplied to a display 18 for displaying the road map in color. For the display 18, a picture display device made of a liquid crystal display panel, etc. is employed and a display device formed separately from the navigation apparatus may also be employed.

Furthermore, an operating unit 19 of the navigation apparatus is connected to the controller 13 and the road map is displayed according to a mode set by operating a key or the like forming the operating unit 19. For example, a range of the map to be displayed, a display reduced scale, etc. can be fixed by the key input.

In addition, the present embodiment has a function, when displaying the map, etc. in this arrangement, to receive information transmitted from the exterior and then to make it to be displayed on the map. The system of transmitting the traffic information termed a VICS is here applied. Describing that system, the traffic information by the VICS is transmitted in a manner that it is multiplexed over a broadcast wave of a FM broadcast which is a radio broadcast, and the road traffic information of a comparatively wide region (traffic jam information, traffic congesting information, traffic regulation information, etc.) is converted to digital data of a predetermined format for transmission. At the same time, the road traffic information of a relatively narrow area is transmitted by using infrared rays or an electric wave from an optical beacon or electric wave beacon installed near the road to a vehicle (motorcar) passing the vicinity of these beacons.

In this case, the traffic information multiplexed over a broadcast wave of the FM broadcast is arranged to have the traffic information of a wide region within an administrative district and to be transmitted in principle from at least one broadcasting station at every administrative district at a frequency allocated to that broadcasting station. However, the traffic information includes at least two kinds of road informations, namely an ordinary road information and an express highway information. Concerning the express highway information, there may be transmitted even the traffic information of the road in front beyond the administrative district where the broadcasting station is installed. The traffic information of a comparatively narrow area emanated from the beacon is transmitted, for example, as the traffic information of the road for ten kilometers around or so.

Firstly, referring to FIG. 1, a configuration for receiving the traffic information multiplexed over a broadcast wave of the FM broadcast will be described. An FM tuner 22 to which a FM antenna 21 is connected receives the broadcast wave of a predetermined frequency (channel) and demodulates the same. Here, the frequency received by the FM tuner 22 is determined by a frequency of a signal supplied from a frequency synthesizer 23. The frequency of the signal output by the frequency synthesizer 23 is set under the control of a FM controller 25.

The broadcast wave received and demodulated by the FM tuner 22 is supplied to a FM multiplex decoder 24 where data modulated on a subcarrier is decoded. Under the control of the FM controller 25, the decoder 24 decodes data of required classification, makes the decoded data to be stored in a RAM 26 connected to the FM controller 25, and makes the data stored in the RAM 26 to be renewed whenever new data is received. In this case, under the control of the FM controller 25, the decoder 24 decodes the data concerning the traffic information to make the data to be stored in the RAM 26.

The traffic information stored in the RAM 26 is transmitted to the navigation controller 13 as occasion demands. The traffic information is reflected on the road map depicted under the control of the navigation controller 13. For example, concerning the road which is indicated that it is jammed or congested by the traffic information, it processes to display the same with a different color in the map from other roads so that it can be seen from the displayed map that the relevant road is jammed or congested. As an alternative other than such changing color for displaying the road, it may be arranged to directly display the jammed section, etc. with letters and the like. Also, when a route setting to a destination is performed, the navigation controller 13 may process to set a route avoiding the jam or congestion according to the received traffic information. During this route setting, it is also conceived to indicate the established route on the displayed map.

In this embodiment, it is arranged that, when setting the receiving frequency of the FM broadcast under the control of the FM controller 25, a table of frequencies corresponding to secondary meshes as a frequency list prepared beforehand in the FM controller 25 and the data of the current location measured by the GPS processing unit 12 are utilized for setting an appropriate frequency. Although a specific example of the frequency setting will be described later on, in order to perform this process, the data of the measured location estimated by the navigation controller 13 is supplied to the FM controller 25.

Moreover, a beacon receiving unit 27 is provided in the navigation apparatus according to the present embodiment. The beacon receiving unit 27 receives the infrared ray signal from the optical beacon or the electric wave from the electric wave beacon on the road, and then the traffic information obtained by demodulating the received signal is supplied to the navigation controller 13 from the beacon receiving unit 27. The traffic information obtained by the beacon receiving unit 27 is also utilized during the depiction of the map, during the route setting and so forth.

Figure 2:
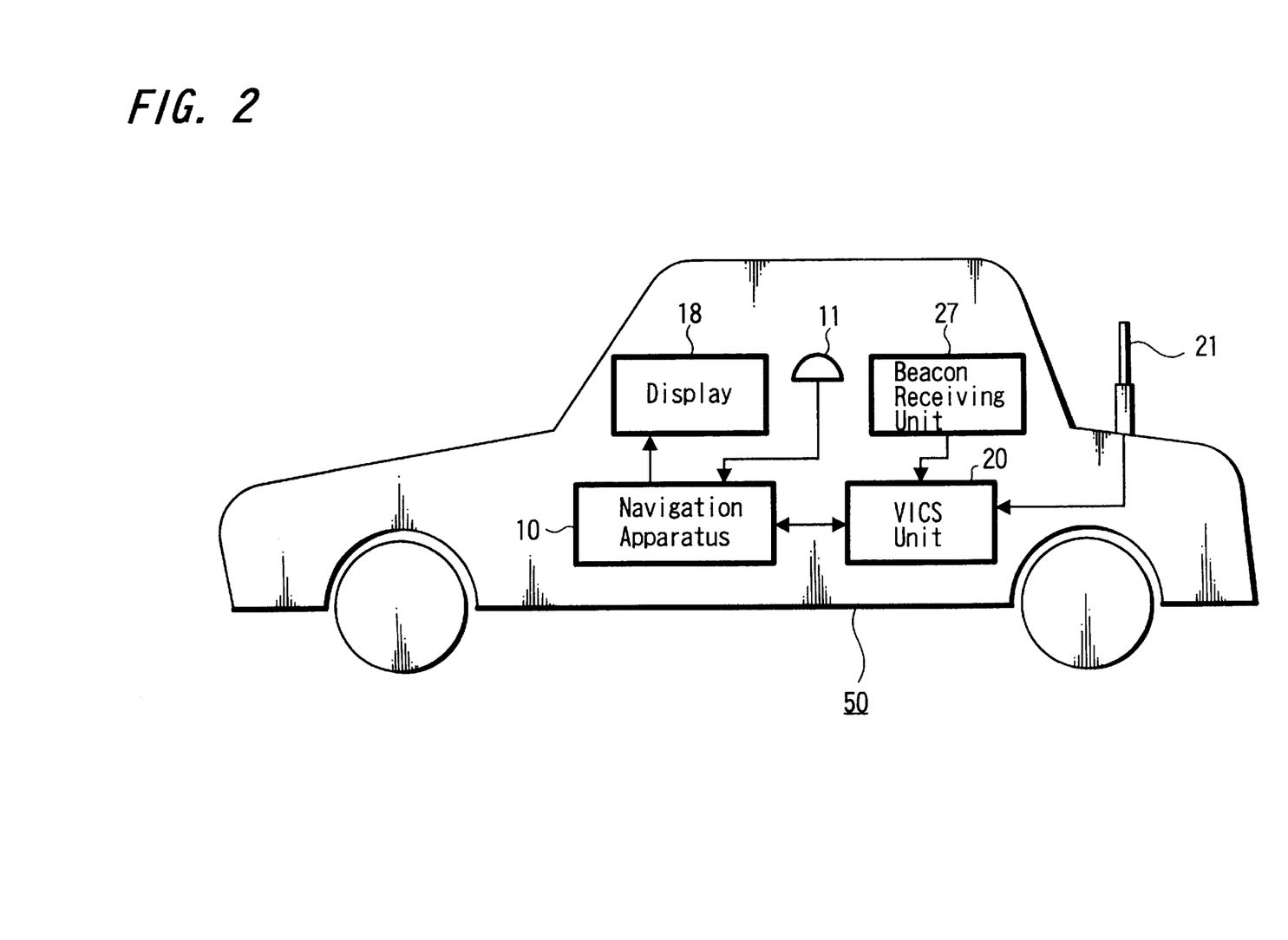
FIG. 2 is a schematic diagram showing a condition in which the apparatus according to an embodiment of the present invention is mounted on a motorcar.

Now, an example in which the navigation apparatus according to the present embodiment is installed in a motorcar will be described with reference to FIG. 2. The body of a navigation apparatus 10 is placed in a predetermined space within a motorcar 50 (a space under a dashboard or within a trunk, etc.). The antenna 11 for the GPS fixed inside or outside the motorcar 50 is connected to the body of the navigation apparatus 10. The display 18 which displays the map or the like processed by the navigation apparatus 10 is installed at a position where the driver can see it, such as on the dashboard besides a driver's seat or the like. A VICS unit 20 which is comprised of an FM tuner, an FM controller and so on is connected to the body of the navigation apparatus 10. The FM antenna 21 and the beacon receiving unit 27 of the motorcar 50 are connected to the VICS unit 20. The operating unit 19 is not shown in FIG. 2, but it may be, for example, a remote control device which transmits an operating command to the body of the navigation apparatus 10 by means of the infrared ray signal or the like.

Next, the processing to receive the traffic information multiplexed over the broadcast wave of the FM broadcast by the navigation apparatus according to the present embodiment will be described. In case of the VICS system to which the apparatus according to the present embodiment is applied, the range where the traffic information can be received is divided into regions of a square whose one side distance is, for example, 80 km to form primary meshes. The numbers of the primary meshes to which respective regions pertains are determined by the system. These primary mesh numbers are indicated by numbers of, e.g., four digits. Each of the primary meshes divided by 80 km is further divided into areas of a square whose one side distance is, for example 10 km to form secondary meshes. The numbers of the secondary meshes to which respective districts are pertain are determined by the system.

Figure 3:
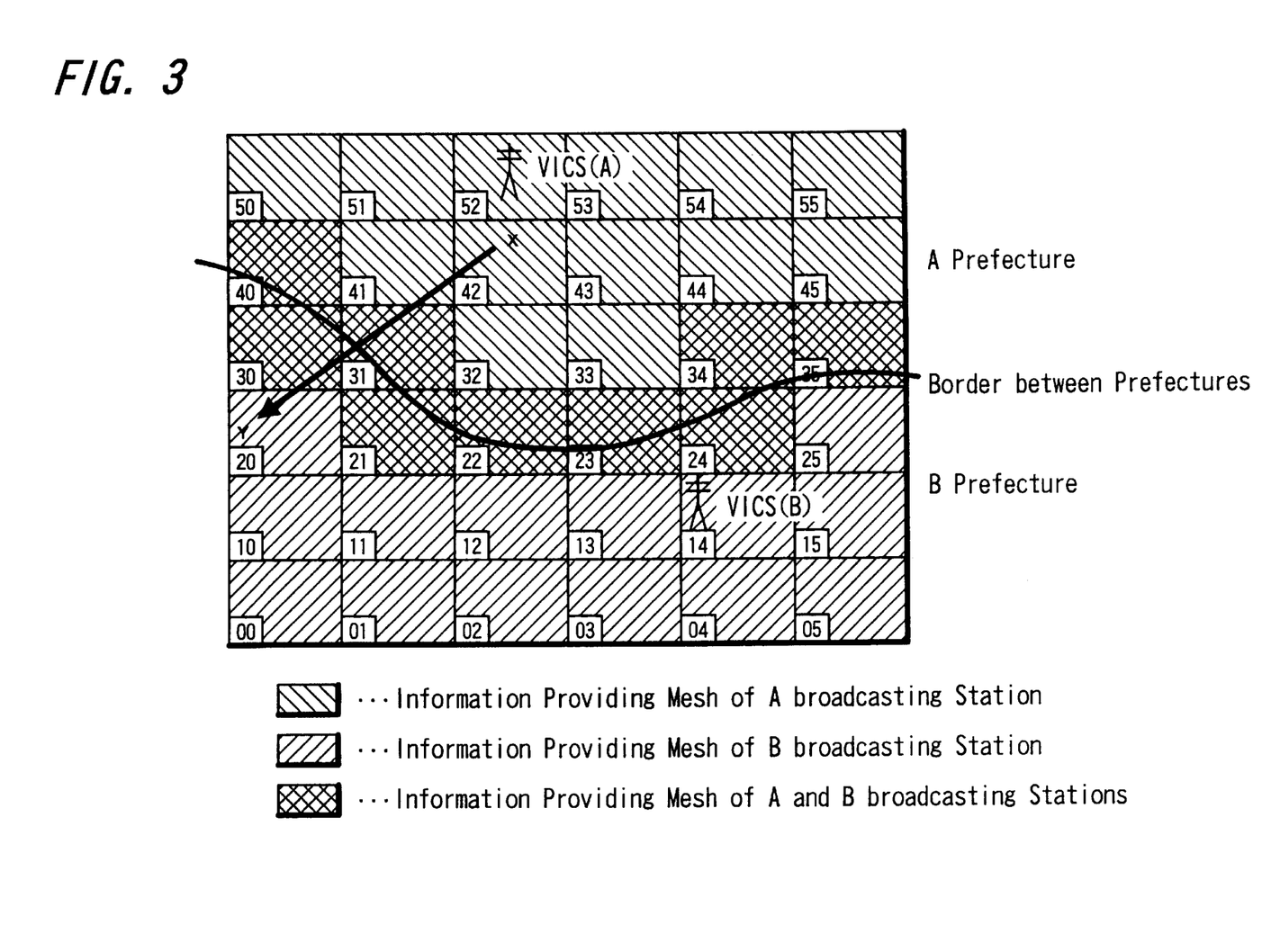
FIG. 3 is an explanatory diagram showing an example of information providing meshes.

FIG. 3 shows an example of a situation in which the secondary meshes are set. In FIG. 3, the secondary mesh numbers are established by two-digit numbers as [00], [01], [02], . . . within one primary mesh whose one side distance is 80 km (in FIG. 3, a partial region of one primary mesh is shown.). When transmitting the traffic information by the VICS, a coverage (district) for providing the information is established using these primary mesh and secondary mesh as a unit.

In the region shown in FIG. 3, there is a border between an A prefecture and a B prefecture, and the traffic information transmitted from the FM broadcasting station for transmitting the VICS data of A prefecture is arranged to transmit the traffic information of the secondary mesh district which belongs to at least the A prefecture. The traffic information transmitted from the FM broadcasting station for transmitting the VICS data of B prefecture is arranged to transmit the traffic information of the secondary mesh district which belongs to at least the B prefecture. Therefore, in each of the secondary meshes to which the border between the prefectures pertains the traffic information from both the broadcasting station of A prefecture and the broadcasting station of B prefecture are transmitted.

Figure 4:
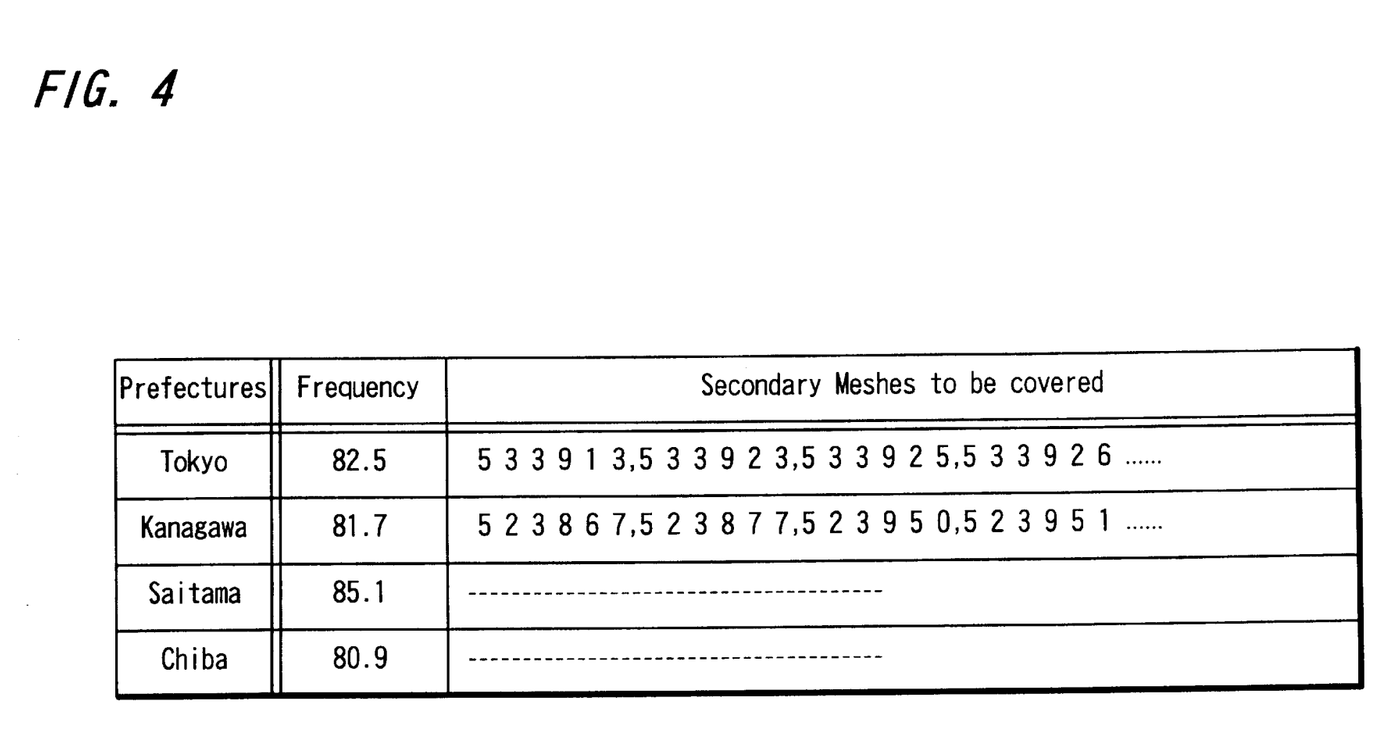
FIG. 4 is an explanatory diagram showing an example of a table of frequencies corresponding to information providing meshes.

In the FM controller 25 of the navigation apparatus according to this embodiment, transmitting frequencies of the FM broadcasting stations for transmitting the VICS data of each administrative district and the data of the secondary mesh area which is covered by the traffic information given by the VICS data transmitted at the transmitting frequency are prepared in advance as data stored in a table. FIG. 4 shows an example of the table of the frequencies corresponding to the secondary meshes. As is shown in FIG. 4, the frequency at which data of each of the administrative districts is transmitted and the numbers of primary meshes and secondary meshes covered by those frequency are stored for every administrative district. Here, the number of each mesh is indicated by numbers of six digits, the first four digits indicating the primary mesh numbers and the remaining two digits indicating the secondary mesh numbers.

Figure 5:
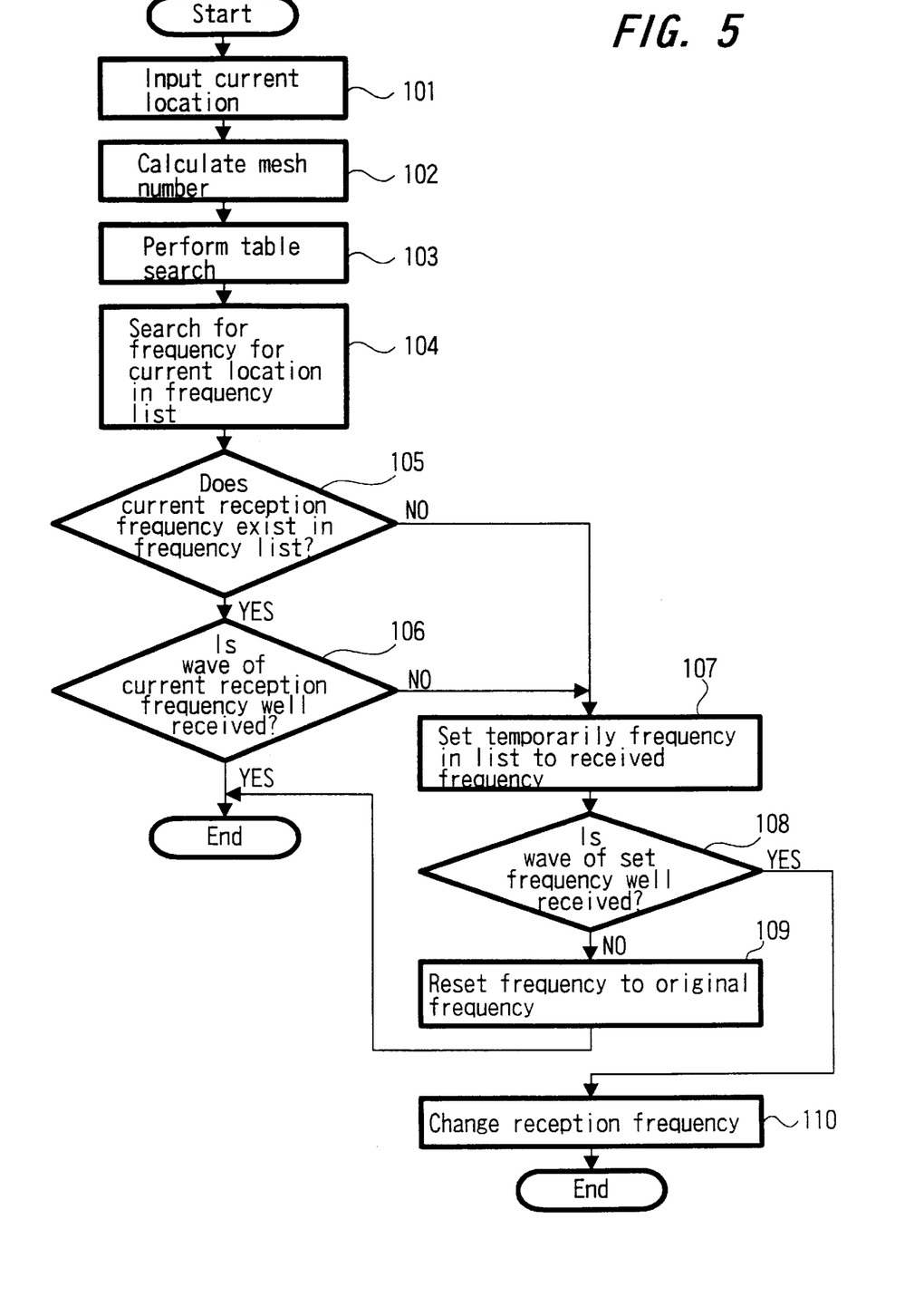
FIG. 5 is a flowchart showing the frequency changing process according to an embodiment of the present invention.
Figure 6:
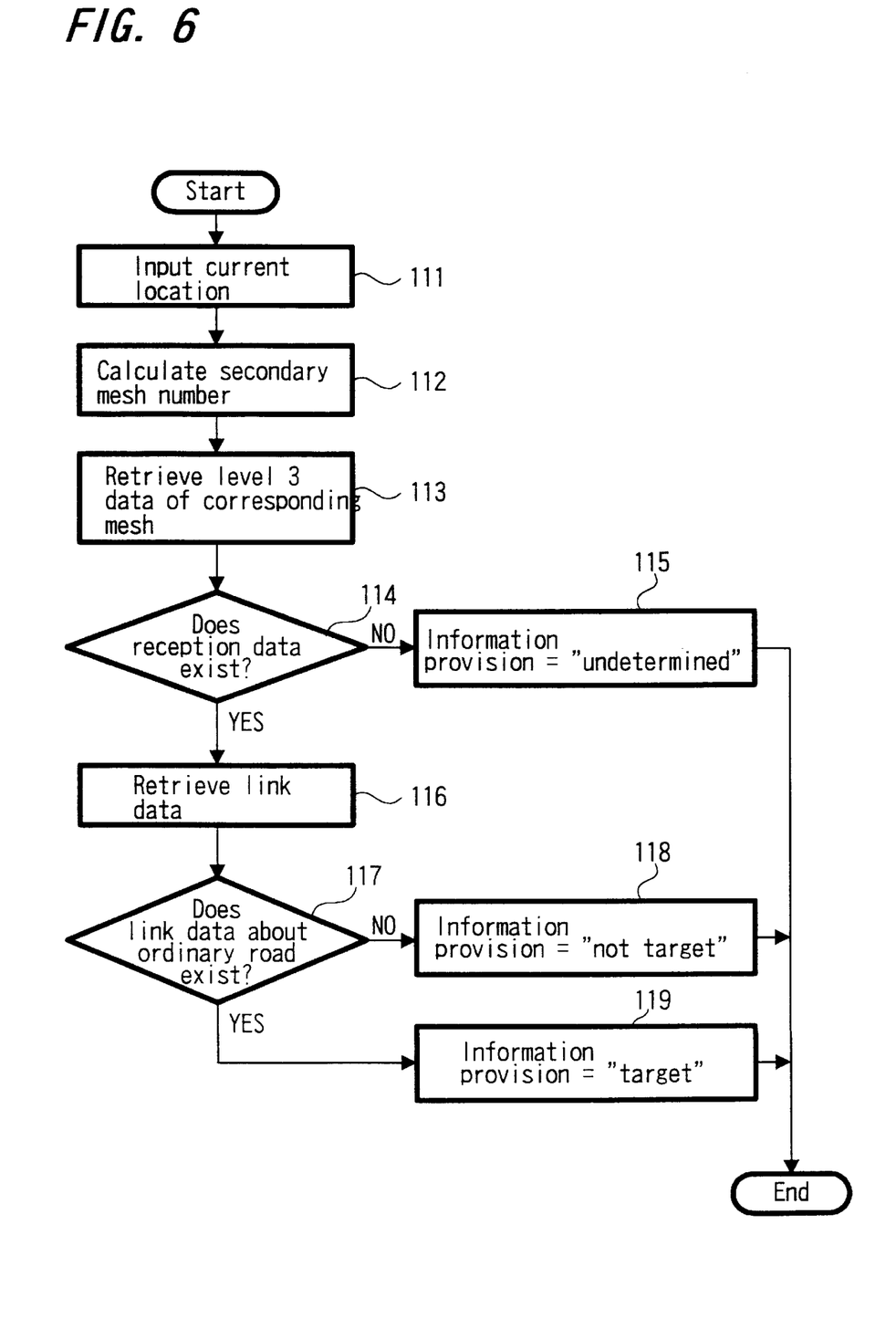
FIG. 6 is a flowchart showing the provided information deciding process according to an embodiment of the present invention.

Under these arrangements, the receiving frequency control processings under the control of the FM controller 25, for example, as shown in flow charts of FIG. 5 and FIG. 6 are carried out. The processing shown by the flow chart of FIG. 5 is a processing to estimate whether or not there is a need to change a receiving frequency, when the receiving frequency is first set up by some means and the VICS data received at that frequency is decoded by the FM multiplex decoder 24. The processing will be described below. The FM controller 25 receives the input data of the current location measured by the GPS processing unit 12 and the like from the navigation controller 13 as occasion demands (step 101). On receipt of the current location data, it performs a processing to calculate the mesh numbers (the primary mesh number and the secondary mesh number) to which the location pertains (step 102). Having calculated the mesh numbers, the FM controller 25 searches the table data shown in FIG. 4 prepared in itself (step 103) and estimates the frequency at which data of the mesh numbers can be gained (step 104). At that time, in the border between prefectures or the like, a plurality of frequencies may exist for one mesh number.

When searching the table data of the current location at steps 103 and 104, a provided information deciding process according to the flow chart of FIG. 6 is performed. The provided information deciding process will be described below with reference to the flow chart of FIG. 6. Inputting the current location (step 111) and estimating the area to which the location pertains, namely, the mesh numbers (the primary mesh number and the secondary mesh number) (STEP 112) are performed. However, in fact, since the same process has been performed at steps 101 and 102 in the flow chart of FIG. 5, only reading and storing the data estimated at these steps is here performed. Subsequently, detailed traffic information within the secondary mesh thus estimated (for the VICS system, the data of level 3) is retrieved from the data decoded by the FM multiplex decoder 24 (step 113).

In this retrieval, it is estimated whether or not the received data of the traffic information of the road within the secondary mesh of the current location estimated at step 112 exists (step 114). If the traffic information within this secondary mesh does not exist, an estimated result as to whether the information is provided or not is made "unclear" (step 115) and a corresponding flag, etc. is raised to end the provided information deciding process.

At the estimation of step 114, if it is estimated that the road traffic information of the road within the secondary mesh at the current location exists, the link data contained in that road traffic information (i.e. data indicating specifically a place such as jammed section and congested section etc.) is retrieved (step 116). On the basis of the retrieved results of this link data, it is estimated whether or not the link data of ordinary road exists (step 117). Here, if the link data of ordinary road does not exist within the relevant secondary mesh (i.e. if only the link data of express highway exists), the estimated result as to whether the information is provided or not is made "non-object" (step 118) and the corresponding flag, etc. is raised to end the provided information deciding process. If on the other hand, the link data of ordinary road exists within the relevant secondary mesh, the estimated result as to whether or not the information is provided is made "object" (step 119) and the corresponding flag, etc. is raised to end the provided information deciding process.

After the provided information deciding has been performed in this manner, the process returns to the frequency changing process in the flow chart of FIG. 5. That is, it is estimated whether or not the currently received frequency by the control of the FM controller 25 exists in the list of frequencies corresponding to the mesh numbers estimated from the current location at steps 102, 103 (step 105). Here, if it is estimated that the currently receiving frequency exists in the frequency list estimated from the location, it is then estimated if the current reception of that frequency is made well to such an extent that the VICS data can correctly be decoded (step 106). If it is estimated that the reception is made well, the receiving frequency is then left as it is for standing by. However, even if it is estimated that the reception is made well, in case where the estimated result as to whether the information is provided in the flow chart of FIG. 6 is "non-object" or "unclear", then the process will move to step 107 described later on. Only when the estimated results to whether the information is provided is "object", the receiving frequency is left as it is for standing by.

When it is estimated at step 105 that the currently receiving frequency does not exist in the frequency list estimated from the location and when it is estimated at step 106 that the currently receiving frequency cannot be received well, a frequency indicated in the frequency list found at step 104 (when estimated at step 106 that it is not well received, a frequency other than that frequency estimated not well received) is made to temporarily be set for the receiving frequency (step 107). Here, it is estimated whether this temporarily set receiving frequency is well received to such an extent that the VICS data can correctly be decoded (step 108). If estimated that it is well received, a processing in which the receiving frequency is changed to that temporarily set receiving frequency takes place (step 110).

At step 108, if it is estimated that the temporarily set receiving frequency cannot be received well, the original receiving frequency is set again to stand by (step 109). In addition, if there are a plurality of frequencies in the frequency list estimated at step 104, the plurality of frequencies may temporality be received at step 107 and 108 and then it may be estimated whether or not the respective frequencies are well received. The frequency best received may be set at step 110.

In case where the receiving frequency is changed at step 110, the provided information deciding process shown in the flow chart of FIG. 6 is performed at the changed receiving frequency. If the estimated result in the provided information deciding process as to whether or not the information is provided is "object", the receiving frequency is left as it is. If the result is "non-object" or "unclear", when there is a further different frequency in the frequency list decided at step 104, the different frequency is made to be set for performing the provided information deciding process and then the receiving frequency is set according to the estimated result as to whether or not the information is provided. However, at step 110, if the decided result of "object" is not obtained at any of the frequencies, a frequency at which the most provable result is obtained (e.g. if it is "non-object" for one of the frequencies and "unclear" for the other of the frequencies, a receiving frequency at which "unclear" is obtained) is made to be set.

By performing the receiving frequency changing process in this way, for example, even though the receiving frequency which was set first by some operation or the like is appropriate with the location at that time, when the current location changes due to the movement of the motorcar on which the navigation apparatus is mounted, a receiving frequency suitable for that location is estimated from the data of the table which is the frequency list stored in the FM controller 25 or the reception control unit of the FM multiplex data, and if the estimated frequency can be received well, the receiving frequency is automatically changed to the frequency estimated from the table data, thus causing the receiving frequency at which the area information in the vicinity of that location is always provided to be automatically established. Especially, in case of the present embodiment, since the provided information deciding process shown in the flow chart of FIG. 6 is performed, it is estimated whether or not the road traffic information of the area(secondary mesh) to which the current location pertains can be acquired through the received signal at the receiving frequency at that time. Then, and if the road traffic information of that area can be gained, it is then estimated that the appropriate receiving frequency is established. Therefore, the more surely appropriate receiving frequency will be set up.

Accordingly, as far as the motor moves within an area where the VICS service takes place, it is possible to acquire the road traffic information, etc. in the vicinity of a moving location at that time from the data multiplexed over FM broadcast. Moreover, it is possible to always display based on the received road traffic information, etc. the jammed section, the congested section, the closed road information and the like on the map of the road near the current location to be displayed in the display 18 of the navigation apparatus by, for example, changing a color of the road to be displayed or displaying the jammed section, etc. in letters or the like. Therefore, it is possible to prevent the situation where the reception is changed over to that of another broadcasting station providing information of an adjacent area as in the past and so the traffic information near the current location can not be gained.

Furthermore, in a case of the present embodiment, since, in the provided information deciding process shown in the flow chart of FIG. 6, as illustrated at step 117, it is estimated whether or not information of ordinary road in the relevant area exists, thereby causing information of express highway in that area to be neglected, it is possible to prevent an erroneous decision using the express highway information which provides information of very large regions and to correctly perform the provided information deciding process on the basis of the ordinary road information.

Moreover, in a case of the present embodiment, even when it is estimated if the currently receiving frequency is not well received at step 106 in the flow chart of FIG. 5, another frequency at which information is transmitted near the current location is also estimated based on the information of the table or the frequency list, and when this estimated frequency is different from the currently receiving frequency, if the estimated frequency is receivable as a result of an attempt to receive it, the receiving frequency is changed over to that frequency. Therefore, even if the receiving condition goes worse due to the change of the moving location and the like, when there is another frequency which is well receivable, automatic changeover will advantageously be performed. Especially, if there are a plurality of FM broadcasting stations of the same network in the same administrative district (e.g. if there is a satellite station), the process against the deterioration of the receiving condition is performed, so that it will be always possible to receive satisfactorily necessary information and to process it at any time, whichever location the motorcar is moving through.

In addition, while in the above example the process has been described, in which, when the location is changed due to the movement after the receiving frequency has been set up by means of some operation, etc., the receiving frequency is changed over to an appropriate one, even when the receiving frequency is initially established, it may be arranged that the FM controller 25 estimates a receiving frequency at which the traffic information of the current location measured by the navigation apparatus, etc. is obtained and that frequency is received. By arranging in this manner, any operation to set up the receiving frequency in order to receive the traffic information, etc. will not be required at all.

Also, in the above example, while the provided information deciding process shown in the flow chart of FIG. 6 is performed when there is a change of the currently moving location, etc. and it is estimated if the established receiving frequency is appropriate, this is also applicable to a case where, when setting a location other than the current location and making the road map, etc. of that location to be displayed, the road traffic information of that location displayed is received for display. Specifically, when, for example, another location different from the current location (destination, etc.) is specified and the road map near the specified location is to be displayed, if the specified location resides in the same prefecture as the current location (or in an adjacent prefecture), the road traffic information near that location is most likely acquired from the received signal by the FM tuner 22, and so it may be arranged that the provided information deciding process shown in the flow chart of FIG. 6 is performed and then the appropriate receiving frequency is made to be established.

Moreover, while, in the above embodiment, the present invention is applied to the case where the road map is displayed by the navigation apparatus which is mounted on the motorcar, it is of course applicable to a case where information which is received by the navigation apparatus for another vehicle is displayed. Furthermore, while, in the above embodiment, the information to be received includes traffic information multiplexed over the FM broadcast, the present invention is also applicable to a case where district information other than the traffic information is to be received. At the same time, when data is transmitted by other various systems, the prevent invention is also applicable to a case where necessary district information is to be received.

In addition, while, in the above embodiment, the data of the table which is the frequency list for estimating the receiving frequency is stored in the FM controller which is or the reception control unit, another portion may be prepared for that purpose. For example, the data of the receiving frequencies corresponding to the primary and secondary meshes may be stored in the disc storing the map data for the reception control unit to use that stored data by reading it out of that disc.

Also, while, in the above embodiment, the navigation apparatus is what uses the positioning system by the GPS, it is of course applicable to the navigation apparatus which measures the location by other system (e.g. the autonomous navigation).

According to the information receiving method of a first aspect of the present invention, because it is estimated if the information of an area in the vicinity of the current location is contained in the received signal at that time, the advantageous result is obtained, in which the frequency for receiving the necessary district information can satisfactorily be established.

According to the information receiving method of a second aspect of the present invention, by receiving the traffic information of the predetermined district, multiplexed over the broadcast wave and then displaying the received traffic information on the road map in a predetermined form or mode, it is possible to always receive the frequency at which the traffic information in the vicinity of the current location can be acquired, which enables a good guidance due to the received traffic information.

According to the information receiving method of a third aspect of the present invention, since it is arranged that, when estimating whether the information of the current location is contained in the received signal at that time, the estimation is made based on the ordinary road information, there is no possibility of making an erroneous estimation due to the express highway information of a wide region.

According to the information receiving method of a fourth aspect of the present invention, because it is estimated if the signal contains the information of the area covering the specified location instead of the current location, it is also possible to specify an arbitrary location and then establish the frequency to receive the information of the district of that location.

According to the navigation apparatus of a fifth aspect of the present invention, since it is estimated if the area information of the location estimated by the location estimating unit is contained in the signal received by the signal receiving unit, it is possible to provide the navigation apparatus in which the frequency to receive the necessary district information in the signal receiving unit is well established and which is capable of processing for display the received information of that district within the map processed for display by the map display processing unit.

According to the navigation apparatus of a sixth aspect of the present invention, by receiving the traffic information of the predetermined district, multiplexed over the broadcast wave in the signal receiving unit and then processing for display the received traffic information on the road map in a predetermined mode in the map display processing unit, it is possible to always receive the frequency at which the traffic information in the proximity of the estimated location is gained, thereby enabling the good map display due to the received traffic information.

According to the navigation apparatus of a seventh aspect of the present invention, since it is arranged that, when estimating whether the information of the estimated location is contained in the signal received by the signal receiving unit, the estimation is made based on the ordinary road information, it is possible to prevent the erroneous frequency setting by the wrong estimation due to the express highway information of a wide region.

According to the motorcar of an eighth aspect of the present invention, because it is estimated whether the information of the area covering the motorcar location estimated by the location estimating unit is contained in the signal received by the signal receiving unit, the frequency at which the district information of the area in the proximity of the motorcar location can be received is satisfactorily established, thereby making the received information of that district to be automatically displayed within the map displayed in the display.

According to the motorcar of a ninth aspect of the present invention, by receiving the traffic information of the predetermined district, multiplexed over the broadcast wave in the signal receiving unit and then displaying the received traffic information on the road map in a predetermined manner by the display, it is possible to receive the frequency at which the traffic information in the vicinity of the current location is always acquired and then to display the good map due to the received traffic information.

According to the motorcar of a tenth aspect of the present invention, since it is arranged that, when estimating whether the information of the current location is contained in the signal received in the signal receiving unit, the estimation is made based on the ordinary road information, it is possible to prevent the erroneous frequency setting by the wrong estimation due to the express highway information of a wide region.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An information receiving method for a mobile unit of receiving a transmitted district information transmitted at a predetermined frequency and then displaying the received district information from a received signal, comprising the steps of:

estimating a current location of the mobile unit and then determining whether a current location district information of a current location area to which the estimated current location pertains is included in said received signal; and performing, when it is determined that the current location district information of the current location area to which the current location pertains is not included in the received signal, a process for changing said predetermined frequency.

2. An information receiving method according to claim 1, wherein the transmitted district information transmitted at said predetermined frequency is a road traffic information of a predetermined district, which is multiplexed over a broadcast wave, and further comprising the step of displaying road traffic information received on a road map in a predetermined mode.

3. An information receiving method according to claim 1, wherein when the transmitted district information contains at least one of ordinary road information and express highway information, the determination as to whether the current location district information of the current location area to which the current location pertains is included in the received signal is performed only by detecting a presence of said ordinary road information in the received signal.

4. An information receiving method according to claim 1, wherein a specified location area to which a specified location pertains is estimated instead of said current location being estimated and then it is determined when specified location district information of the estimated specified location area is included in the received signal.

5. A navigation apparatus for a mobile unit, comprising;

a recording medium for storing map information;

a readout unit for reading out the map information stored in said recording medium;

a location estimating unit for estimating an estimated location of the mobile unit;

a signal receiving unit for receiving a signal transmitted at a predetermined frequency, the received signal including received signal district information;

a map display processing unit for controlling said readout unit to read estimated location map information in a vicinity of the estimated location estimated by said location estimating unit and processing to display a map according to the read out estimated location map information and the received signal district information received by said signal receiving unit;

a frequency list storing unit for storing frequency information concerning a frequency which is included in the received signal district information received by said signal receiving unit; and a frequency control unit for determining whether estimated location district information of an area corresponding to the estimated location estimated by said location unit is included in the received signal received by said signal receiving unit and, when the estimated location district information is not included in the received signal, controlling to change a reception frequency of said signal receiving unit.

6. A navigation apparatus according to claim 5, wherein the received signal district information received by said signal receiving unit includes road traffic information of a predetermined district, which is multiplexed over a broadcast wave, and the road traffic information received is displayed on the map in a predetermined mode by said map display processing unit.

7. A navigation apparatus according to claim 6, wherein the received signal district information received by said signal receiving unit includes at least one of ordinary road information and express highway information, and the determination in said frequency control unit as to whether the estimated location district information of the area corresponding to the estimated location estimated by said location estimating unit is included in the received signal received by said signal receiving unit is performed by determining whether only ordinary road information corresponding to the estimated location is included in the received signal received by said signal receiving unit.

8. A motorcar, comprising:

a recording medium for storing a map information;

a readout unit for reading out the map information stored in said recording medium;

a location estimating unit for estimating an estimated location of said motorcar;

a signal receiving unit for receiving a signal transmitted at a predetermined frequency, the received signal including received signal district information;

a map display processing unit for controlling said readout unit to read estimated location map information in a vicinity of the estimated location estimated by said location estimating unit and processing to produce a display signal for displaying a map according to the estimated location map information readout and the received signal district information received by said signal receiving unit;

a frequency list storing unit for storing frequency information concerning a frequency which is included in the received signal district information received by said signal receiving unit;

a frequency control unit for determining whether estimated location district information of an area corresponding to the estimated location estimated by said location estimating unit is included in the received signal received by said signal receiving unit and, when the estimated location district information is not included in the received signal, controlling to change a reception frequency of said signal receiving unit; and a display for displaying the received signal district information and the map according to the display signal produced by said map display processing unit.

9. A motorcar according to claim 8, wherein the received signal district information received by said signal receiving unit includes a road traffic information of a predetermined district, which is multiplexed over a broadcast wave, and the road traffic information received is displayed on the map in a predetermined mode by said display.

10. A motorcar according to claim 9, wherein the received signal district information received by said signal receiving unit includes at least one of ordinary road information and express highway information, and the determination in said frequency control unit as to whether the estimated location district information of the area corresponding to the estimated location estimated by location estimating unit is included in the received signal received by said signal receiving unit is performed by determining whether only ordinary road information corresponding to the estimated location is included in the received signal received by said signal receiving unit.

* * * * *